(12) United States Patent
He et al.

(10) Patent No.: US 8,704,336 B2
(45) Date of Patent: Apr. 22, 2014

(54) SELECTIVE REMOVAL OF ON-DIE REDISTRIBUTION INTERCONNECTS FROM SCRIBE-LINES

(75) Inventors: Jun He, Portland, OR (US); Kevin J. Lee, Beaverton, OR (US); Subhash Joshi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1405 days.

(21) Appl. No.: 11/848,879

(22) Filed: Aug. 31, 2007

(65) Prior Publication Data

US 2009/0057842 A1 Mar. 5, 2009

(51) Int. Cl.
*H01L 23/544* (2006.01)
(52) U.S. Cl.
USPC .......................... 257/620; 438/462
(58) Field of Classification Search
USPC .......................... 257/620; 438/462
See application file for complete search history.

(56) References Cited

U.S. PATENT DOCUMENTS

| | | | |
|---|---|---|---|
| 6,159,826 A * | 12/2000 | Kim et al. | 438/460 |
| 6,838,299 B2 | 1/2005 | Mulligan | |
| 7,087,452 B2 | 8/2006 | Joshi | |
| 7,342,320 B2 * | 3/2008 | Hedler et al. | 257/786 |
| 7,566,915 B2 * | 7/2009 | Chang et al. | 257/127 |
| 7,651,882 B1 * | 1/2010 | Bockorick et al. | 438/64 |
| 2005/0127512 A1 * | 6/2005 | Yamagata | 257/758 |
| 2006/0163700 A1 * | 7/2006 | Bae | 257/620 |

OTHER PUBLICATIONS

Dual Layer Dielectric Stack for Microelectronics Having Thick Metal Lines; Filed Sep. 29, 2006; U.S. Appl. No. 11/540,350 US patent application; Lee, Kevin J., et al.
Systems and Methods to Passivate On-Die Redistribution Interconnects; filed—Nov. 8, 2006; U.S. Appl. No.—11/595,645, Jun He, et al.

* cited by examiner

*Primary Examiner* — Mark Tornow
(74) *Attorney, Agent, or Firm* — Cool Patent, P.C.

(57) ABSTRACT

Selective removal of on-die redistribution interconnect material from a scribe-line region is generally described. In one example, an apparatus includes a first semiconductor die having a redistribution layer comprising redistribution dielectric and one or more redistribution metal interconnects, a second semiconductor die coupled with the first semiconductor die, the second semiconductor die having a redistribution layer comprising redistribution dielectric and one or more redistribution metal interconnects, and a scribe-line region disposed between the first semiconductor die and second semiconductor die, the scribe-line region having a majority or substantially all of redistribution dielectric or redistribution metal, or suitable combinations thereof, selectively removed to enable die singulation through the scribe-line region.

7 Claims, 4 Drawing Sheets

SELECTIVE REMOVAL OF ON-DIE REDISTRIBUTION INTERCONNECTS FROM SCRIBE-LINES

TECHNICAL FIELD

Embodiments disclosed herein are generally directed to the field of semiconductor fabrication and, more particularly, to selective removal of on-die redistribution interconnects from scribe-lines.

BACKGROUND

Generally, semiconductor devices are formed on wafers having multiple dies separated by scribe-lines. The devices may be separated into single die units by cutting through the scribe-lines using a die singulation process such as sawing.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
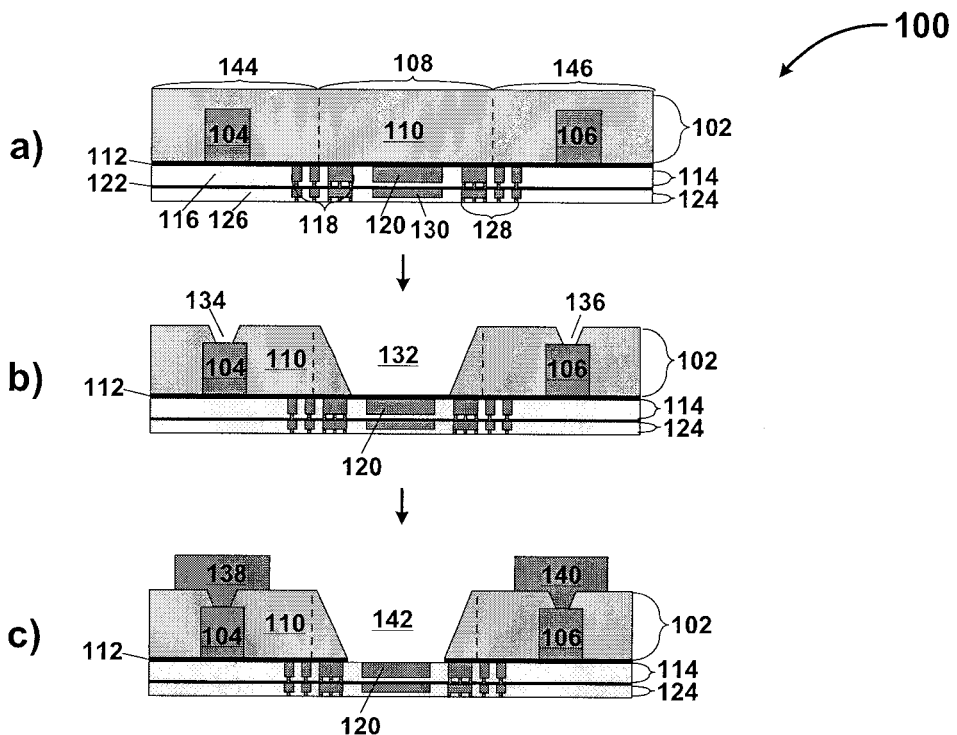
FIG. 1 is a cross-section schematic of selective removal of on-die redistribution interconnect material from a scribe-line region, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of selective removal of on-die redistribution interconnect material from a scribe-line region are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a cross-section schematic of selective removal of on-die redistribution interconnect material from a scribe-line region 108, according to but one embodiment. In an embodiment according to FIG. 1a, an apparatus 100 includes a redistribution interconnect layer 102, one or more metal interconnects 104, 106, scribe-line region 108, first semiconductor die 144, second semiconductor die 146, redistribution dielectric 110, etch stop and/or passivation film 112, interconnect layer 114, interlayer dielectric (ILD) 116, one or more metal interconnects 118, e-test pad 120, etch stop film 122, interconnect layer 124, interlayer dielectric 126, one or more metal interconnects 128, and e-test pad 130, each coupled as shown.

Generally, semiconductor devices are formed on wafers having multiple dies separated by scribe-lines. The devices may be separated into single die units by cutting through the scribe-lines using a die singulation process such as sawing. As the devices continue to scale, the number of interconnect layers may increase. For example, nine metal interconnect layers or more may be currently used in semiconductor devices. Also, the thickness of the redistribution interconnect layer may increase as well. Thick redistribution dielectric and/or metal features in the scribe-line region may make die singulation by cutting or sawing more difficult. Implementing a saw and/or laser scribe process to cut through thick redistribution dielectric may significantly increase process throughput time, result in short saw blade lifetimes, and compromise die sidewall quality after singulation. In addition, thick redistribution material in the scribe-line may interfere with electrical probing (i.e.—e-test) of the finished wafer. Scribe-line e-test prior to the formation of the redistribution interconnect layer may be undesirable because e-test would be performed on unfinished wafers.

First semiconductor die 144 may only depict a small portion of a first semiconductor die and may include the portion of apparatus 100 to the left of the leftmost boundary of scribe-line region 108 including redistribution layer 102, etch stop films 112, 122, and interconnect layers 114, 124. Second semiconductor die 146 may only depict a small portion of a second semiconductor die and may include the portion of apparatus 100 to the right of the rightmost boundary of scribe-line region 108 including redistribution layer 102, etch stop films 112, 122, and interconnect layers 114, 124. Apparatus 100 may be formed on a wafer including multiple scribe-line interfaces as depicted in FIG. 1. In an embodiment, a wafer is a semiconductor wafer such as a silicon wafer. In an embodiment, first 144 and second 146 semiconductor dies are coupled together on a semiconductor wafer. Analogous depictions in FIGS. 1-5 may incorporate similar embodiments.

Redistribution dielectric 110 may be a continuous layer that spans across first semiconductor die 144, scribe-line region 108, and second semiconductor die 146. ILD 116 and ILD 126 may continuously span across the regions defined by first semiconductor die 144, scribe-line region 108, and second semiconductor die 146. In an embodiment, metal interconnects 118 are intended to represent similar metal interconnects within interconnect layer 114 (i.e.—the interconnects in layer 114 above interconnects 128). In another embodiment, metal interconnects 128 are intended to represent similar metal interconnects within interconnect 124 (i.e.—the interconnects in layer 124 below interconnects 118). Analogous depictions in FIGS. 1-5 may incorporate similar embodiments.

An apparatus 100 may include more interconnect layers than depicted. In an embodiment, an apparatus 100 includes nine interconnect layers where interconnect layer 124 is the seventh layer, interconnect layer 114 is the eighth layer, and the redistribution layer 102 is the ninth layer. Analogous depictions in FIGS. 1-5 may incorporate similar embodiments.

In an embodiment, apparatus 100 includes a first semiconductor die 144 having a redistribution layer 102 that includes redistribution dielectric 110 and one or more redistribution metal interconnects 104, a second semiconductor die 146 having a redistribution layer 102 that includes redistribution dielectric 110 and one or more redistribution metal interconnects 106, and a scribe-line region 108 disposed between the first semiconductor die 144 and second semiconductor die 146, the scribe-line region 108 having a majority or substantially all of redistribution dielectric 110 or redistribution metal (omitted in this embodiment), or suitable combinations thereof, selectively removed 132 to enable die singulation through the scribe-line region 108. In another embodiment, the scribe-line region 108 is substantially free of redistribution dielectric 110 or redistribution metal, or suitable combinations thereof, to enable die singulation through the scribe-line region 108.

In an embodiment, apparatuses 100 as depicted in FIGS. 1a-1c are formed by a plate through resist or subtractive metallization method using thick photosensitive redistribution dielectric 110. In an embodiment according to FIG. 1a, no metal interconnect is formed in the scribe-line region 108 redistribution dielectric 110. Redistribution dielectric 110 in the scribe-line region 108 may be spin-coated onto an etch stop and/or passivation film 112 and redistribution metal interconnects 104, 106 in the regions of the first semiconductor die 144, scribe-line 108, and second semiconductor die 146. The thickness of the redistribution dielectric 102 may be sufficient such that the redistribution dielectric 110 also serves as a bump 138, 140 passivation layer for interconnects 104, 106.

In an embodiment, redistribution dielectric 110 is photosensitive to enable simultaneous removal 132 of redistribution dielectric 110 from the scribe-line region 108 with opening of vias 134, 136 into the redistribution dielectric of the first and second dies for bump formation. In an embodiment, selective removal 132 of scribe-line 108 redistribution dielectric 110 occurs during a spin, expose, and develop process to open bump-to-redistribution interconnect vias 134, 136. The spin, expose, and develop process may be referred to as patterning for simplicity. In another embodiment, materials for a redistribution dielectric 110 are selected to enable a photodefinable spin-on dielectric material that may be patterned simultaneously with vias 134, 136. In an embodiment, the absence of thick redistribution interconnect material 110 in the scribe-lines 108 increases the throughput of the die singulation process, reduces saw blade wear out, and leads to improved die sidewall quality after singulation.

In an embodiment, an etch stop/passivation film 112 such as SiN, silicon carbide ($SiC_xH_y$), silicon nitride ($SiN_xH_y$), nitrogen-doped silicon carbide ($SiC_xN_yH_z$), or oxygen-doped silicon carbide ($SiC_xO_yH_z$), or other nitride, is selectively removed in the scribe-line region 108 underlying the removed redistribution dielectric 142 as depicted in FIG. 1c, where x, y, or z represent suitable stoichiometric quantities throughout this description. Bumps 138, 140 may be formed on the first 144 and second 146 dies. In an embodiment, an etch stop/passivation film 112 is selectively removed in the scribe-line region 108 by etching. Selective removal of the etch stop/passivation film 112 may expose an e-test pad 120 for electrical probing of the wafer prior to die singulation. According to an embodiment, the metal of the interconnects 118, 128, the e-test pads 120, 130, and redistribution interconnects 104, 106 include copper, aluminum, or suitable combination thereof such as aluminum-copper alloy. In an embodiment, the absence of thick redistribution interconnect material 110 in the scribe-line region 108 enables e-test to be performed on fully processed wafers.

Figure 2:
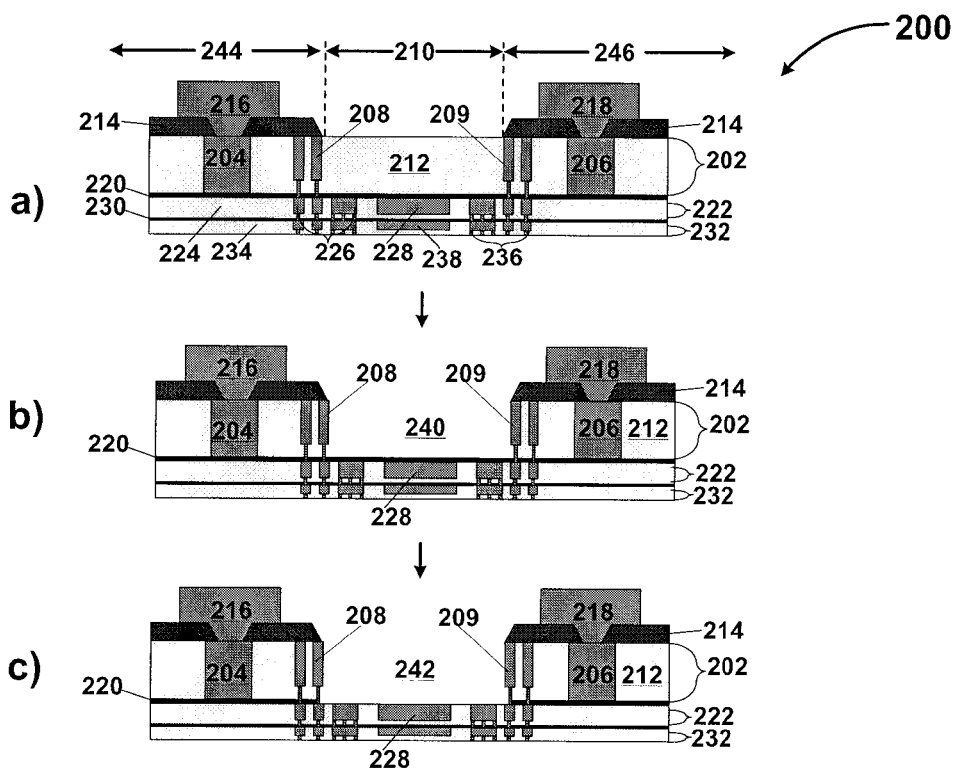
FIG. 2 is an alternative cross-section schematic of selective removal of on-die redistribution interconnect material from a scribe-line region, according to but one embodiment.

FIG. 2 is an alternative cross-section schematic of selective removal of on-die redistribution interconnect material from a scribe-line region 200. In an embodiment according to FIG. 2a, an apparatus 200 includes a redistribution interconnect layer 202, one or more metal interconnects 204, 206, first guard ring 208, second guard ring 209, scribe-line region 210, first semiconductor die 244, second semiconductor die 246, redistribution dielectric 212, passivation 214, bumps 216, 218, etch stop film 220, interconnect layer 222, ILD 224, one or more metal interconnects 226, e-test pad 228, etch stop film 230, interconnect layer 232, ILD 234, one or more metal interconnects 236, and e-test pad 238, each coupled as shown.

In an embodiment, apparatus 200 includes a first semiconductor die 244 having a redistribution layer 202 that includes redistribution dielectric 212 and one or more redistribution metal interconnects 204, a second semiconductor die 246 having a redistribution layer 202 that includes redistribution dielectric 212 and one or more redistribution metal interconnects 206, and a scribe-line region 210 disposed between the first semiconductor die 244 and second semiconductor die 246, the scribe-line region 210 having a majority or substantially all of redistribution dielectric 212 or redistribution metal (omitted in this embodiment), or suitable combinations thereof, selectively removed 240 to enable die singulation through the scribe-line region 210.

In an embodiment, an apparatus 200 includes a first guard ring 208 at the interface of the first semiconductor 244 and scribe-line region 210, the first guard ring 208 including metal that spans the thickness of the redistribution layer 202 at said interface (i.e.—between first die 244 and scribe-line 210). The first guard ring 208 may also span the length (i.e.—in or out of the page) of the scribe-line 210 edge or interface of the first semiconductor die 144. In an embodiment, the first guard ring 208 provides hermetic protection of the first semiconductor die 244 or provides an etch stop for chemical removal of redistribution dielectric 212 in the scribe-line region 210, or suitable combinations thereof.

In an embodiment, an apparatus 200 includes a second guard ring 209 at the interface of the second semiconductor 246 and scribe-line region 210, the second guard ring 209 including metal that spans the thickness of the redistribution layer 202 at said interface. The second guard ring 209 may also span the length (i.e.—in or out of the page) of the scribe-line 210 edge or interface of the second semiconductor die 246. In an embodiment, the second guard ring 209 provides hermetic protection of the second semiconductor die 246 or provides an etch stop for chemical removal of redistribution dielectric 212 in the scribe-line region 210, or suitable combinations thereof.

In another embodiment, an apparatus 200 includes a passivation layer 214 deposited onto the redistribution dielectric 212 of the first 244 and second 246 dies, the passivation layer having one or more pad openings formed therein for bump 216, 218 formation.

In an embodiment, apparatuses 200 as depicted in FIGS. 2a-2c are formed by a damascene-type method such as dual damascene. In an embodiment according to FIG. 2a, no metal interconnect is formed in the scribe-line region's 210 redistribution dielectric 212. In an embodiment, one or more bumps 216, 218 are formed upon the pad openings in the passivation layer 214. According to an embodiment, redistribution dielectric 212 in the scribe-line region 210 is selectively removed 240 using a suitable dielectric etch process. Guard rings 208, 209 may provide an etch stop for chemical removal such as etching. In an embodiment, the bumps 216, 218 and the passivation layer 214 act as an etch mask. Bumps 216, 218 and passivation 214 prevent etching of redistribution dielectric 212 of the first 244 and second 266 dies upon etching away 240 the redistribution dielectric 212 in the scribe-line region 210, according to an embodiment. In an embodiment, the scribe-line region 210 is the region between the guard rings 208, 209. In an embodiment, the absence of thick redistribution interconnect material 212 in the scribe-lines 210 increases the throughput of the die singulation process, reduces saw blade wear out, and leads to improved die sidewall quality after singulation.

In an embodiment, an etch stop film 220 such as SiN, silicon carbide ($SiC_xH_y$), silicon nitride ($SiN_xH_y$), nitrogen-doped silicon carbide ($SiC_xN_yH_z$), or oxygen-doped silicon carbide ($SiC_xO_yH_z$), or other nitride, underlying the removed redistribution dielectric 242 is selectively removed in the scribe-line region 210 as depicted in FIG. 2c. In an embodiment, an etch stop film 220 is selectively removed in the scribe-line region 210 by etching. Selective removal 242 of the etch stop film 220 may expose an e-test pad 228 for electrical probing of the wafer prior to die singulation. In an embodiment, the absence of thick redistribution interconnect material 240, 242 in the scribe-line region 210 enables e-test to be performed on fully processed wafers.

Figure 3:
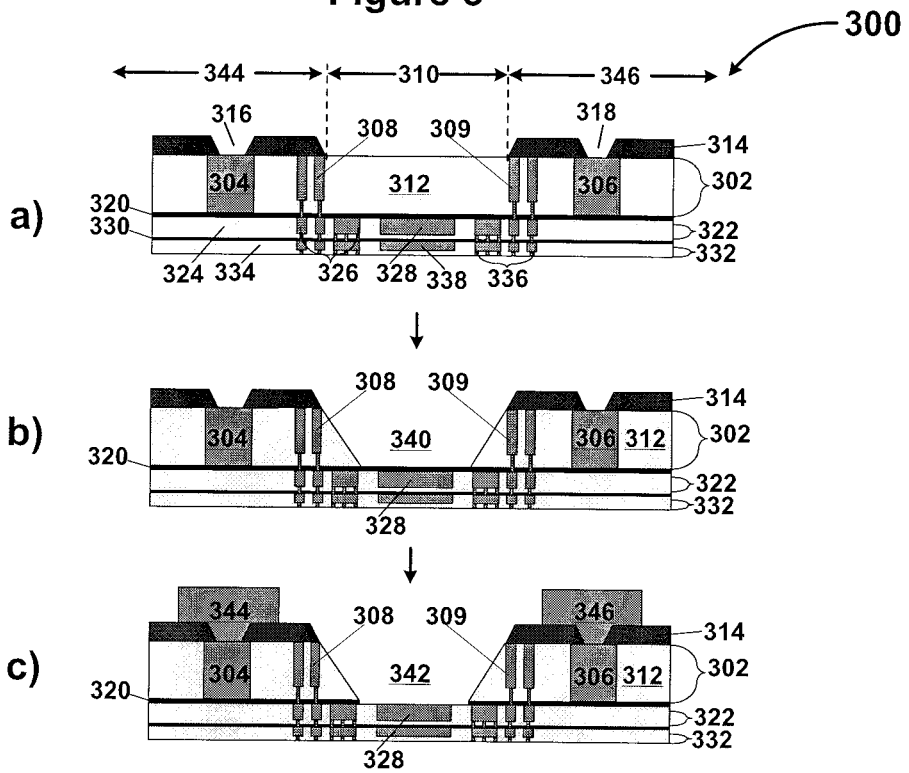
FIG. 3 is another alternative cross-section schematic of selective removal of on-die redistribution interconnect material from a scribe-line region, according to but one embodiment.

FIG. 3 is another alternative cross-section schematic of selective removal of on-die redistribution interconnect material from a scribe-line region 300, according to but one embodiment. In an embodiment according to FIG. 3a, an apparatus 300 includes a redistribution interconnect layer 302, one or more metal interconnects 304, 306, first guard ring 308, second guard ring 309, scribe-line region 310, first semiconductor die 344, second semiconductor die 346, redistribution dielectric 312, passivation 314, vias 316, 318, etch stop film 320, interconnect layer 322, ILD 324, one or more metal interconnects 326, e-test pad 328, etch stop film 330, interconnect layer 332, ILD 334, one or more metal interconnects 336, and e-test pad 338, each coupled as shown.

In an embodiment, apparatus 300 includes a first semiconductor die 344 having a redistribution layer 302 that includes redistribution dielectric 312 and one or more redistribution metal interconnects 304, a second semiconductor die 346 having a redistribution layer 302 that includes redistribution dielectric 312 and one or more redistribution metal interconnects 306, and a scribe-line region 310 disposed between the first semiconductor die 344 and second semiconductor die 346, the scribe-line region 310 having a majority or substantially all of redistribution dielectric 312 or redistribution metal (omitted in this embodiment), or suitable combinations thereof, selectively removed 340 to enable die singulation through the scribe-line region 310.

In an embodiment, an apparatus 300 includes a first 308 and second 309 guard ring that provide similar function with respect to a first 344 and second die 346 as already described for guard rings 208, 209 in apparatus 200.

In another embodiment, an apparatus 300 includes a passivation layer 314 deposited onto the redistribution dielectric 312 of the first 344 and second 346 dies, the passivation layer 314 having one or more pad openings or vias 316, 318 formed therein for bump 344, 346 formation.

In an embodiment, apparatuses 300 as depicted in FIGS. 3a-3c are formed by a damascene-type method such as dual damascene. In an embodiment according to FIG. 3a, no metal interconnect is formed in the scribe-line region's 310 redistribution dielectric 312. In an embodiment, one or more bumps 316, 318 are formed upon the pad openings in the passivation layer 314 after selective removal of redistribution dielectric 312 in the scribe-line 310. According to an embodiment, redistribution dielectric 312 in the scribe-line region 310 is selectively removed 340 using a suitable dielectric etch process. In an embodiment, redistribution dielectric 312 in the scribe-line 310 is selectively removed during dielectric etch in the scribe during pad opening 316, 318 formation. In another embodiment, redistribution dielectric 312 in the scribe-line 310 is selectively removed by a chemical etch that occurs prior to bump 344, 346 formation during a pad opening 316, 318 step in the passivation layer 314, the etch forming sloped sidewalls in the redistribution dielectric 312 in the scribe-line region 310 such that the first 308 and second 309 guard rings remain covered by the sidewalls. In an embodiment, the absence of thick redistribution interconnect material 312 in the scribe-lines 310 increases the throughput of the die singulation process, reduces saw blade wear out, and leads to improved die sidewall quality after singulation.

In an embodiment, an etch stop film 320 such as SiN, silicon carbide ($SiC_xH_y$), silicon nitride ($SiN_xH_y$), nitrogen-doped silicon carbide ($SiC_xN_yH_z$), or oxygen-doped silicon carbide ($SiC_xO_yH_z$), or other nitride, underlying the removed redistribution dielectric 340 is selectively removed in the scribe-line region 310 as depicted in FIG. 4c. In an embodiment, an etch stop film 320 is selectively removed in the scribe-line region 310 by etching after bump 344, 346 plating. Selective removal 342 of the etch stop film 320 may expose an e-test pad 328 for electrical probing of the wafer prior to die singulation. In an embodiment, the absence of thick redistribution interconnect material 340, 342 in the scribe-line region 310 enables e-test to be performed on fully processed dies 344, 346 that are still coupled together in wafer form.

Figure 4:
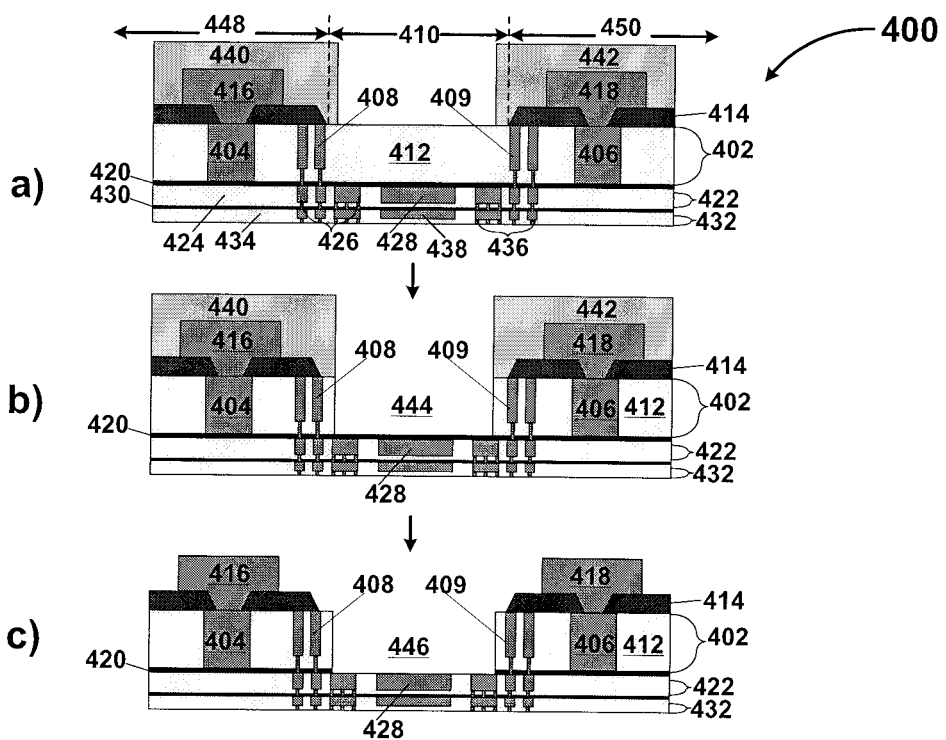
FIG. 4 is another alternative cross-section schematic of selective removal of on-die redistribution interconnect material from a scribe-line region, according to but one embodiment.

FIG. 4 is another alternative cross-section schematic of selective removal of on-die redistribution interconnect material from a scribe-line region 400, according to but one embodiment. In an embodiment according to FIG. 4a, an apparatus 400 includes a redistribution interconnect layer 402, one or more metal interconnects 404, 406, first guard ring 408, second guard ring 409, scribe-line region 410, first semiconductor die 448, second semiconductor die 450, redistribution dielectric 412, passivation 414, bumps 416, 418, etch stop film 420, interconnect layer 422, ILD 424, one or more metal interconnects 426, e-test pad 428, etch stop film 430, interconnect layer 432, ILD 434, one or more metal interconnects 436, e-test pad 438, and photoresist 440, 442, each coupled as shown.

In an embodiment, apparatus 400 includes a first semiconductor die 448 having a redistribution layer 402 that includes redistribution dielectric 412 and one or more redistribution metal interconnects 404, a second semiconductor die 450 having a redistribution layer 402 that includes redistribution dielectric 412 and one or more redistribution metal interconnects 406, and a scribe-line region 410 disposed between the first semiconductor die 448 and second semiconductor die 450, the scribe-line region 410 having a majority or substantially all of redistribution dielectric 412 or redistribution metal (omitted in this embodiment), or suitable combinations thereof, selectively removed 444 to enable die singulation through the scribe-line region 410.

In an embodiment, an apparatus 400 includes a first 408 and second 409 guard ring that provide similar function with respect to a first 448 and second die 450 as already described for guard rings 208, 209 in apparatus 200.

In another embodiment, an apparatus 400 includes a passivation layer 414 deposited onto the redistribution dielectric 412 of the first 448 and second 450 dies, the passivation layer 414 having one or more pad openings or vias formed therein for bump 416, 418 formation.

In an embodiment, apparatuses 400 as depicted in FIGS. 4a-4c are formed by a damascene-type method such as dual damascene. In an embodiment according to FIG. 4a, no metal interconnect is formed in the scribe-line region's 410 redistribution dielectric 412. In an embodiment, one or more bumps 416, 418 are formed upon the pad openings in the passivation layer 414 prior to selective removal of redistribution dielectric 412 in the scribe-line 410. According to an embodiment, redistribution dielectric 412 in the scribe-line region 410 is selectively removed 444 using photoresist patterning 440, 442 after bump 416, 418 plating. A photoresist 440, 442 may enable an etch process to selectively remove dielectric from areas 444 not covered by resist 440, 442. In an embodiment, the absence 444 of thick redistribution interconnect material 412 in the scribe-lines 410 increases the throughput of the die singulation process, reduces saw blade wear out, and leads to improved die sidewall quality after singulation.

In an embodiment, an etch stop film 420 such as SiN, silicon carbide ($SiC_xH_y$), silicon nitride ($SiN_xH_y$), nitrogen-doped silicon carbide ($SiC_xN_yH_z$), or oxygen-doped silicon carbide ($SiC_xO_yH_z$), or other nitride, underlying the removed redistribution dielectric 444 is selectively removed in the scribe-line region 410 as depicted in FIG. 4c. In an embodiment, an etch stop film 420 is selectively removed in the scribe-line region 410 by etching. Selective removal 446 of the etch stop film 420 may expose an e-test pad 428 for electrical probing of the wafer prior to die singulation. In an embodiment, the absence of thick redistribution interconnect material 444, 446 in the scribe-line region 410 enables e-test to be performed on fully processed dies 448, 450 that are still coupled together in wafer form.

Figure 5:
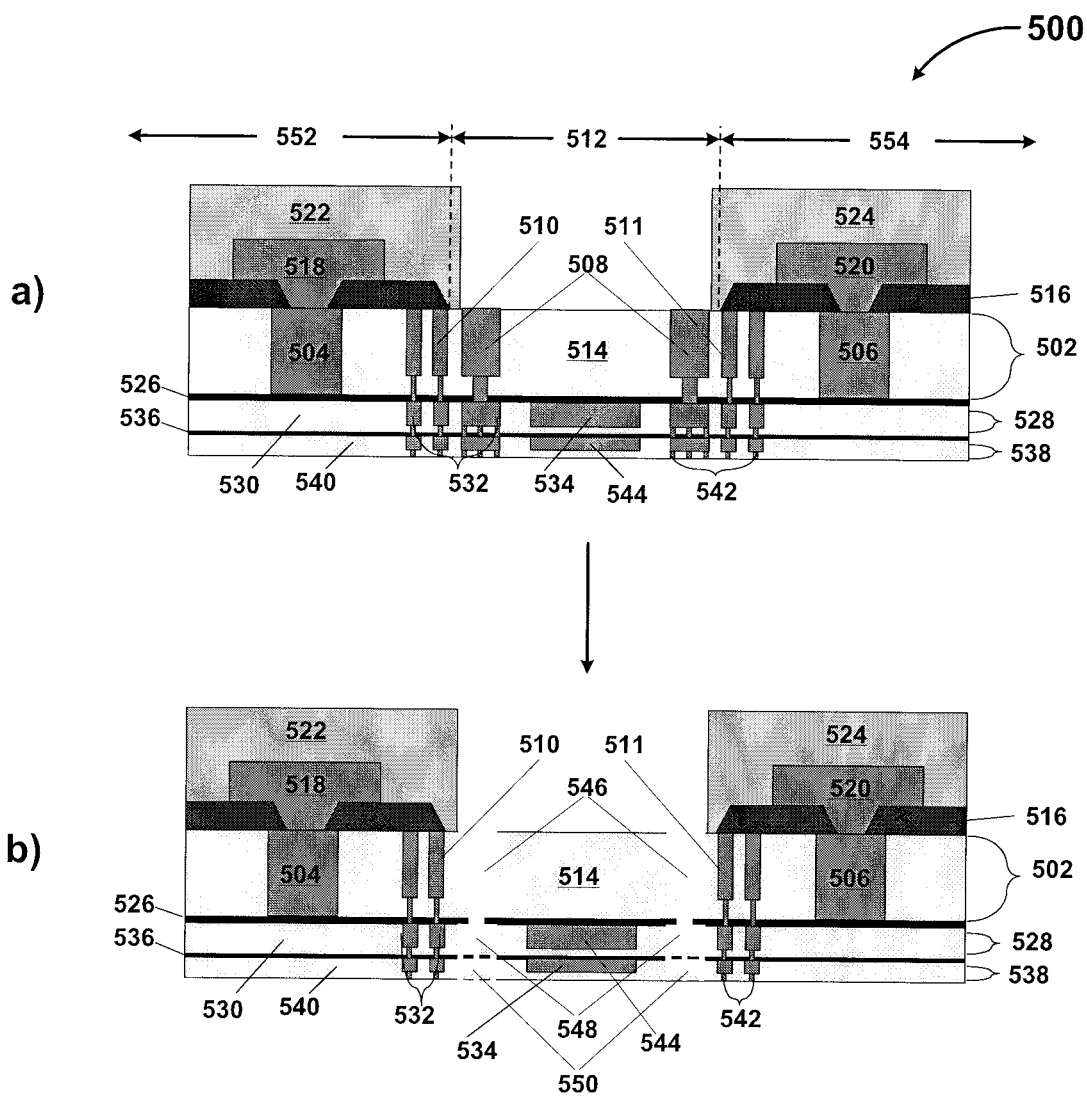
FIG. 5 is another alternative cross-section schematic of selective removal of on-die redistribution interconnect material from a scribe-line region, according to but one embodiment.

FIG. 5 is another alternative cross-section schematic of selective removal of on-die redistribution interconnect material from a scribe-line region 500, according to but one embodiment. In an embodiment according to FIG. 5a, an apparatus 500 includes a redistribution interconnect layer 502, one or more metal interconnects 504, 506, scribe-line redistribution metal 508, first guard ring 510, second guard ring 511, scribe-line region 512, first semiconductor die 552, second semiconductor die 554, redistribution dielectric 514, passivation 516, bumps 518, 520, etch stop film 526, interconnect layer 528, ILD 530, one or more metal interconnects 532, e-test pad 534, etch stop film 536, interconnect layer 538, ILD 540, one or more metal interconnects 542, e-test pad 544, and photoresist 522, 524, each coupled as shown.

In an embodiment, apparatus 500 includes a first semiconductor die 552 having a redistribution layer 502 that includes redistribution dielectric 514 and one or more redistribution metal interconnects 504, a second semiconductor die 554 having a redistribution layer 502 that includes redistribution dielectric 514 and one or more redistribution metal interconnects 506, and a scribe-line region 512 disposed between the first semiconductor die 552 and second semiconductor die 554, the scribe-line region 512 having a majority or substantially all of redistribution dielectric 514 or redistribution metal 508, or suitable combinations thereof, selectively removed 546 to enable die singulation through the scribe-line region 512.

In an embodiment, an apparatus 500 includes a first 510 and second 511 guard ring that provide similar function with respect to a first 552 and second die 554 as already described for guard rings 208, 209 in apparatus 200.

In another embodiment, an apparatus 500 includes a passivation layer 516 deposited onto the redistribution dielectric 514 of the first 552 and second 554 dies, the passivation layer 516 having one or more pad openings or vias formed therein for bump 518, 520 formation.

In an embodiment, apparatuses 500 as depicted in FIGS. 5a-5b are formed by a damascene-type method such as dual damascene. In an embodiment according to FIG. 5a, scribe-line redistribution metal 508 is disposed in the scribe-line region's 512 redistribution dielectric 514. Redistribution metal 508 may be referred to as a sacrificial guard ring according to an embodiment. In an embodiment, one or more bumps 518, 520 are formed upon the pad openings in the passivation layer 516 prior to selective removal of redistribution metal 508 in the scribe-line 512.

According to an embodiment, redistribution metal 508 in the scribe-line region 512 is selectively removed 546 using photoresist patterning 522, 524 after bump 518, 520 plating. A photoresist 522, 524 may enable an etch process such as Cu/barrier etch to selectively remove metal 508 from areas not covered by resist 522, 524. In another embodiment, redistribution metal 508 is removed using a laser such as a laser scribe. In another embodiment, chemical removal or laser-assisted removal of redistribution metal 508 also removes underlying interconnects 548, 550 to form an air gap that physically isolates active die 552 and 554 from mechanical damage that may occur in the scribe region 514 during singulation. In other embodiments, redistribution dielectric 514 is also selectively removed from the scribe-line 512. E-test may be performed on redistribution metal 508 prior to removal 546 or may be performed on e-test pad 534, or previous layer e-test pads such as pad 544 after removal of redistribution dielectric 514 and etch stop film 526 in the scribe-line 512. In an embodiment, the absence 546 of thick redistribution interconnect material 546 in the scribe-lines 512 increases the throughput of the die singulation process, reduces saw blade wear out, and leads to improved die sidewall quality after singulation.

Figure 6:
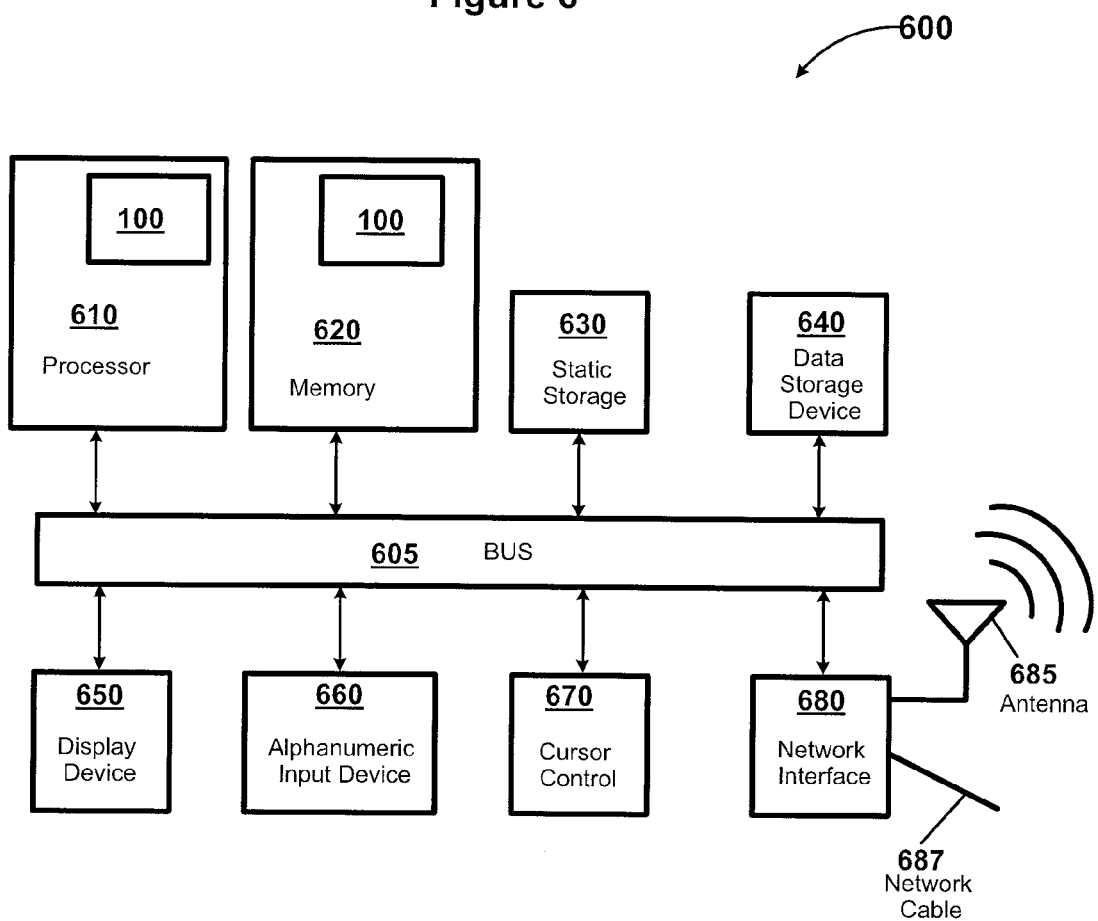
FIG. 6 is a diagram of an example system in which embodiments of the present invention may be used, according to but one embodiment.

FIG. 6 is a diagram of an example system in which embodiments of the present invention may be used, according to but one embodiment. System 600 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 600 includes a first or second semiconductor apparatus 100, 200, 300, 400, 500 after die singulation and/or packaging or assembly processes in accordance with embodiments described with respect to FIGS. 1-5. Only apparatus 100 is depicted in FIG. 6 for simplicity, however, apparatus 100 may represent embodiments according to apparatuses 100, 200, 300, 400, and/or 500 described herein. In an embodiment, a semiconductor apparatus 100 using selective removal of on-die redistribution interconnect material from a scribe-line region is part of an electronic system's memory 620 or processor 610.

Electronic system 600 may include bus 605 or other communication device to communicate information, and processor 610 coupled to bus 605 that may process information. While electronic system 600 may be illustrated with a single processor, system 600 may include multiple processors and/or co-processors. In an embodiment, processor 610 includes a semiconductor apparatus 100 integrating selective removal of on-die redistribution interconnect material from a scribe-line region in accordance with embodiments described herein. System 600 may also include random access memory (RAM) or other storage device 620 (may be referred to as memory), coupled to bus 605 and may store information and instructions that may be executed by processor 610.

Memory 620 may also be used to store temporary variables or other intermediate information during execution of instructions by processor 610. Memory 620 is a flash memory device in one embodiment. In another embodiment, memory 620 includes a semiconductor apparatus integrating selective removal of on-die redistribution interconnect material from a scribe-line region 100 as disclosed herein.

System 600 may also include read only memory (ROM) and/or other static storage device 630 coupled to bus 605 that may store static information and instructions for processor 610. Data storage device 640 may be coupled to bus 605 to store information and instructions. Data storage device 640 such as a magnetic disk or optical disc and corresponding drive may be coupled with electronic system 600.

Electronic system 600 may also be coupled via bus 605 to display device 650, such as a cathode ray tube (CRT) or liquid crystal display (LCD), to display information to a user. Alphanumeric input device 660, including alphanumeric and other keys, may be coupled to bus 605 to communicate information and command selections to processor 610. Another type of user input device is cursor control 670, such as a mouse, a trackball, or cursor direction keys to communicate information and command selections to processor 610 and to control cursor movement on display 650.

Electronic system 600 further may include one or more network interfaces 680 to provide access to network, such as a local area network. Network interface 680 may include, for example, a wireless network interface having antenna 685, which may represent one or more antennae. Network interface 680 may also include, for example, a wired network interface to communicate with remote devices via network cable 687, which may be, for example, an Ethernet cable, a coaxial cable, a fiber optic cable, a serial cable, or a parallel cable.

In an embodiment, a system 300 includes one or more omnidirectional antennae 685, which may refer to an antenna that is at least partially omnidirectional and/or substantially omnidirectional, and a processor 610 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined entirely by the following claims, which are to be construed in accordance with established doctrines of claim interpretation.

What is claimed is:

1. An apparatus, comprising:
    a semiconductor wafer;
    a first semiconductor die comprising a first etch-stop nitride film and a first redistribution layer formed on the first etch-stop nitride film, the first redistribution layer comprising redistribution dielectric and one or more redistribution metal interconnects that correspond to the first semiconductor die;
    a second semiconductor die coupled with the first semiconductor die on the semiconductor wafer, the second semiconductor die comprising a second etch-stop nitride film and a second redistribution layer formed on the second etch-stop nitride film, the second redistribution layer comprising redistribution dielectric and one or more redistribution metal interconnects that correspond to the second semiconductor die, at least a portion of the redistribution dielectric of the first redistribution layer and at least a portion of the redistribution dielectric of the second redistribution layer, when formed, being formed as a continuous redistribution dielectric region disposed between the first semiconductor die and the second semiconductor die, at least a portion of the first etch-stop nitride film and at least a portion of the second etch-stop nitride film, when formed, being formed as a continuous etch-stop nitride film region that is disposed between the first semiconductor die and the second semiconductor die;
    at least one e-test pad formed below the continuous-when-formed etch-stop nitride film region that is disposed between the first semiconductor die and the second semiconductor die, the at least one e-test pad being formed before the continuous-when-formed etch-stop nitride film region is formed;
    a scribe-line region disposed between the first semiconductor die and the second semiconductor die, the scribe-line region being formed by removing substantially all of the first redistribution layer and the second redistribution layer disposed between the first semiconductor die and the second semiconductor die and substantially all of the continuous etch-stop nitride film region disposed between the first semiconductor de and the second semiconductor die, thereby exposing the e-test pad;
    a first guard ring formed at the interface of the first semiconductor and scribe-line region, the first guard ring comprising metal that spans a thickness of the redistribution layer at the interface, the first guard ring also spanning a length of the scribe-line edge of the first semiconductor die, the first guard ring providing hermetic protection of the first semiconductor die or providing an etch stop for chemical removal of redistribution dielectric in the scribe-line region, or a combination thereof; and
    a second guard ring formed at the interface of the second semiconductor and scribe-line region, the second guard ring comprising metal that spans the thickness of the redistribution layer at the interface, the second guard ring also spanning the length of the scribe-line edge of the second semiconductor die, the second guard ring providing hermetic protection of the second semiconductor die or providing an etch stop for chemical removal of redistribution dielectric in the scribe-line region, or a combinations thereof.

2. An apparatus according to claim 1, wherein the redistribution dielectric of the first semiconductor die, the redistribution dielectric of the second semiconductor die, and the first redistribution layer and the second redistribution layer disposed between the first semiconductor die and the second semiconductor die comprise a photosensitive material capable of providing selective removal of redistribution dielectric in the scribe-line region.

3. An apparatus according to claim 2, further comprising a passivation layer deposited onto the redistribution dielectric of the first and second dies, the passivation layer comprising one or more pad openings formed therein for bump formation.

4. An apparatus according to claim 2, further comprising:
one or more bumps formed upon the pad openings in the passivation layer, the bumps or passivation layer preventing etching of redistribution dielectric of the first and second dies when redistribution dielectric in the scribe-line region is selectively removed by etching.

5. An apparatus according to claim 2, wherein the scribe-line region is substantially free of redistribution dielectric as a result of selective removal by a chemical etch that occurs prior to bump formation during a pad opening operation in the passivation layer, the etch forming sloped sidewalls in the redistribution dielectric in the scribe-line region such that the first and second guard rings remain covered by the sidewalls.

6. An apparatus according to claim 2, further comprising:
one or more bumps formed upon the pad openings in the passivation layer, the scribe-line region being substantially free of redistribution dielectric as a result of using photoresist patterning that enables etching away of the redistribution dielectric in the scribe-line region.

7. An apparatus according to claim 2, further comprising:
one or more bumps formed upon the pad openings in the passivation layer, the scribe-line region being substantially free of redistribution dielectric is a result of using photoresist patterning that enables etching away of the redistribution metal in the scribe-line region or a laser to remove redistribution metal in the scribe-line region, or a combination thereof.

* * * * *